United States Patent [19]
Ginetti et al.

[11] Patent Number: 5,825,658
[45] Date of Patent: Oct. 20, 1998

[54] METHOD AND A SYSTEM FOR SPECIFYING AND AUTOMATICALLY ANALYZING MULTIPLE CLOCK TIMING CONSTRAINTS IN A VLSI CIRCUIT

[75] Inventors: Arnold Ginetti, Antibes, France; Athanasius W. Spyrou, San Jose, Calif.; Jean-Michel Fernandez, Antibes; Francois Silve, Le Cannet, both of France

[73] Assignee: VLSI Technology, Inc., San Jose, Calif.

[21] Appl. No.: 528,660

[22] Filed: Sep. 14, 1995

[51] Int. Cl.$^6$ ........................................... G06F 17/50
[52] U.S. Cl. ..................... 364/488; 364/489; 364/490; 364/491
[58] Field of Search ................... 364/488–491, 364/578; 395/500

[56] References Cited

U.S. PATENT DOCUMENTS

| | | | |
|---|---|---|---|
| 5,095,454 | 3/1992 | Huang | 364/578 |
| 5,191,541 | 3/1993 | Landman et al. | 364/489 |
| 5,218,551 | 6/1993 | Agrawal et al. | 364/491 |
| 5,355,321 | 10/1994 | Grodstein et al. | 364/489 |
| 5,384,720 | 1/1995 | Ku et al. | 364/578 |
| 5,426,591 | 6/1995 | Ginetti et al. | 364/489 |
| 5,452,239 | 9/1995 | Dai et al. | 364/578 |
| 5,507,029 | 4/1996 | Granato et al. | 395/500 |
| 5,654,898 | 8/1997 | Roetcisoender et al. | 364/490 |

OTHER PUBLICATIONS

Gupta et al. ("Automated multi–cycle symnbolic timing verification of microprocessor–based designs", 31st Design Automation Conference, 1 Jan. 1994).

Cherry, J.J. et al. ("Pearl: a CMOS timing analyzer", IEEE, Proceedings of the 25th ACM/IEEE Design Automation Conference, 12 Jun. 1988, pp. 148–153).

Swinnen, M. Et al. ("Timing issues related to the automated placement and routing of high performance ASICs", IEEE, Proceedings of the Fourth Annual IEEE International ASIC Conference and Exhibition, 23 Sep. 1991, pp. P14–6/1–4).

Joy, D. A. Et al. ("Clock Period Minimization with Wave Pipelining", IEEE Transactions on Computer–Aided Design of Integrated Circuits and Systems, vol. 12, No. 4, Apr. 1993, pp. 461–472).

*Primary Examiner*—Emanuel Todd Voeltz
*Assistant Examiner*—Phallaka Kik
*Attorney, Agent, or Firm*—Gary S. Williams; Flehr Hohbach Test Albritton & Herbert LLP

[57] ABSTRACT

In a computer aided design system for assisting in the design and analysis of integrated circuits, users can specify an integrated circuit using either a conventional circuit component netlist, or an HDL circuit description. Timing constraints are specified using conventional system level timing constraints, at least one clock timing constraint and a plurality multi-cycle timing constraints specifying clock based timing constraints for the transmission of data between sequential data elements in which at least a subset of the clock based timing constraints concern timing constraints for duration longer than a single clock period. In addition, the user may provide the system with a plurality of constraint based timing path specifications, each indicating signal paths through the integrated circuit to which specified ones of the multi-cycle timing constraints are applicable and signal paths to which the specified ones of the multi-cycle timing constraints are not applicable. The computer aided design system then automatically verifies that the integrated circuit satisifies the specified timing constraints. During the timing constraint verification process, for mutli-clock timing constraints, signal arrival times and required signal arrival times are propagated and back-propagated only through signal paths consistent with the constraint based timing path specifications. In addition, the verified netlist, timing constraints and constraint based timing path specifications may be passed to a silicon compiler for automatically placing/routing a circuit in accordance with the netlist, timing constraints and constraint based timing path specifications.

7 Claims, 8 Drawing Sheets

Constraint No. ⸺114

| 1 | Start Nodes, Start Times<br>End Nodes, End Times |
|---|---|
| 2 | Start Nodes, Start Times<br>End Nodes, End Times |
| ⋮ | |

FIG. 15

METHOD AND A SYSTEM FOR SPECIFYING AND AUTOMATICALLY ANALYZING MULTIPLE CLOCK TIMING CONSTRAINTS IN A VLSI CIRCUIT

FIELD OF THE INVENTION

The present invention is related generally to integrated circuit simulation and circuit optimization, and is particularly related to systems and methods for specifying multi-cycle timing constraints in very large scale integrated (VLSI) circuits for purposes of circuit simulation and circuit optimization.

BACKGROUND OF THE INVENTION

The meaning of a timing constraint will be reviewed and then the syntax and semantics of the COMPASS timing constraint constructs will be introduced.

Definition

A timing constraint specifies a delay between specified nodes in a specified circuit. The specified delay can be a minimum delay or a maximum delay. When the specified delay is a minimum delay we speak about a "minDelay" timing constraint or a lower-bounded timing constraint. When the specified delay is a maximum delay we speak about a "maxDelay" timing constraint or a upper-bounded timing constraint.

More accurately, a maxDelay timing constraint is composed of:
- a set of input nodes;
- a set of output nodes;
- for each input node, a signal maximum arrival time, that is the latest time at which a signal is available on that node;
- for each output node, a signal maximum required time, that is the latest time at which a signal should be available on that node;

and, a minDelay timing constraint is composed of:
- a set of input nodes;
- a set of output nodes;
- for each input node, a signal minimum arrival time, that is the earliest time at which a signal is available on that node;
- for each output node, a signal minimum required time, that is the earliest time at which a signal should be available on that node.

Timing constraints are used for at least the two following different reasons:
- for checking that a design meets some performance requirements;
- for guiding performance driven optimization tools.

Checking a timing constraint consists in propagating a timing constraint input node arrival time value through a simulated representation of the specified circuit and comparing the value of the propagated time and the required time on the timing constraint's output node. For a maxDelay timing constraint, the term "slack" is defined to mean the difference between the required time and the arrival time for any specified timing constraint output node. For a minDelay timing constraint, the term "slack" is defined to mean the difference between the arrival time and the required time for any specified timing constraint output node.

A circuit design is said to be violating a timing constraint when at least one of the timing constraint output node's slack is negative. The worst path of a timing constraint is the path ending on the timing constraint output node whose slack is the smallest (or most negative). Guiding a performance driven optimization tool consists in providing it with the user design and timing constraints and asking it to optimize the designs in order to meet those timing constraints.

Origin of the Timing Constraints

There are many possible origins for timing constraints for a specified circuit. Some examples are:
- the environment in which the specified circuit is to be used may force some arrival times on an external input connector and may require various signals to be ready at specified "required times" on an output connector;
- the clock frequency and phase used by the specified circuit may dictate the arrival times of sequentially generated output data at the circuit's output ports and may also dictate the required time of input data at the circuit's input connector;
- a desired clock latency may require at particular signal arrival time on one or more clocked input nodes and/or may result in a particular required time on one or more particular output nodes.

Clocked Designs

Figure 1:
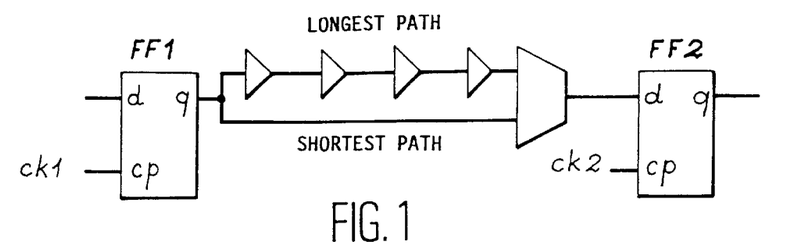
FIGS. 1, 2A, 2B, 3A, 3B, 4A, 4B, 5A, 5B illustrate general knowledge in the domain of specifying "timing constraints" for electronic circuit designs.

In FIG. 1, where there exists one or more combinational paths between the flip-flop ff1 data output connector to the flip-flop ff2 data input connector, the following naming conventions are used:
- ff1 will be called the master flip-flop;
- ff2 will be called the slave flip-flop;
- ck1 will be called the master clock;
- ck2 will be called the slave clock;
- the shortest combinational path between the ff1 data output connector to the ff2 data input connector will be called shortest path; this path is really composed of the ff1 ck1-to-q timing plus the combinational path minus the ff2 hold time;
- the longest combinational path between the ff1 data output connector to the ff2 data input connector will be called the longest path; this path really is composed of the ff1 ck1-to-q timing plus the combinational path plus the ff2 set up time.

A launch edge is an active edge of the master clock and a latch edge is an active edge of the slave clock.

Setup Check

Figure 2A:
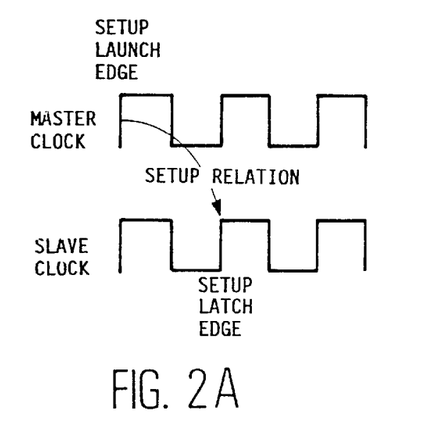
Figure 2B:
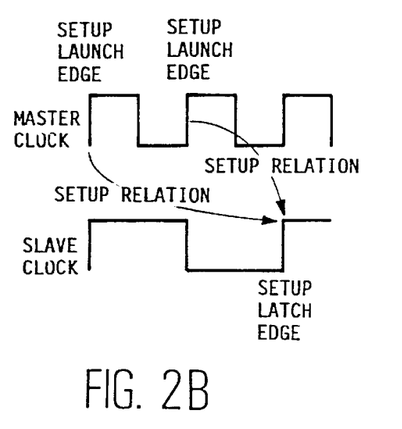

A "setup check" checks setup relations between a pair of flip-flops; a setup relation tells that the correct data signal value is stable on the slave flip-flop in time to be properly latched. A setup relation thus determines one setup launch edge among the list of the launch edges and one set up latch edge among the list of latch edges. The difference between the setup latch edge and setup launch edge implies a maximum delay constraint for the longest path starting on a master flip-flop and ending on a slave flip-flop. In the case of single-frequency design (see FIG. 2A), the setup relation is simple: it checks the longest path between a pair of flip-flops clocked on the same pair of flip-flops.

In that case, the setup check first looks for the smallest difference between the setup latch edges and the setup launch edges. It then checks that the longest path is smaller than that difference.

Hold Check

To guarantee good design behavior, hold relations are checked around all the different setup relations detected by the setup check as follows:
- data "fired" (i.e., latched and presented at the flip-flop output) from the master flip-flop by the master clock active edge that follows the setup launch edge must not be latched into the slave flip-flop by the corresponding setup latch edge;

data fired from the master flip-flop by the setup launch edge must not be latched into the slave flip-flop by the slave clock active edge that precedes the setup launch edge.

Figure 3A:
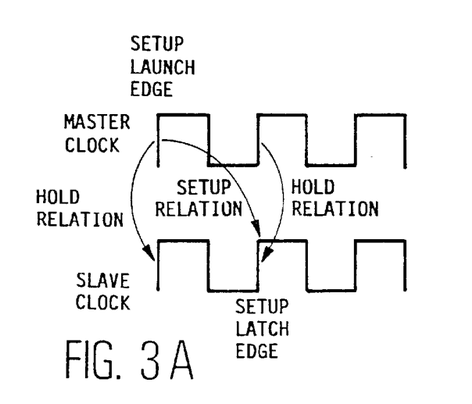
Figure 3B:
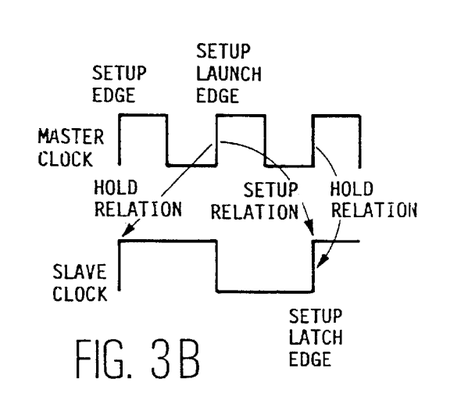

The most restrictive hold relation allows us to define the hold launch edge and the hold latch edge respectively as the master clock active edge and the slave clock active edge creating the hold relation. In turn, the difference between the hold latch edge and the hold launch edge implies a minimum delay constraint for the shortest path starting on a master flip-flop and ending on a slave flip-flop. FIG. 3A shows the hold relations on a single frequency design. FIG. 3B presents the hold relation on a multi-frequency design.

Multi-cycle Clock

Sometimes, for some pairs of flip-flops, the circuit designer will want to relax the default maximum and minimum delay values automatically tested by setup and hold check procedures. The "multi-cycle clock" timing constraint specification mechanism is a general mechanism which allows the user to escape the default detected setup edge and allows the circuit designer or test engineer to redefine the timing relationships being tested. More accurately, multi-cycle timing constraints allow the engineer:

to specify a setup multiplier which usually is the number of slave active edges you want to add to the default setup latch edge for setup checking; if you do not "multi-cycle the clock," the default number is obviously one. More particularly, setting a setup multiplier of "n" pushes forward the setup latch edge by an amount of "n–1" slave clock cycles. The setup multiplier can also be specified as the number of master active edges you want to remove from the default setup launch edge. In this case, setting a setup multiplier of "n" consists in pushing backward the setup launch edge by an amount of "n–1" master clock cycles;

to specify a hold multiplier which usually is the number of master active edges you want to add to the default detected hold setup edge. The default number is zero, whether the slave clock is multi-cycled or not. Setting a hold multiplier of "n" pushes forward the setup launch edge by a quantity of "n" master clock cycle. The hold multiplier can also be specified as the number of slave active edges you want to remove from the setup latch edge; in this later case, setting a hold multiplier of "n" consists in pushing backward the setup latch edge by a quantity of "n" slave clock cycle.

Figure 4A:
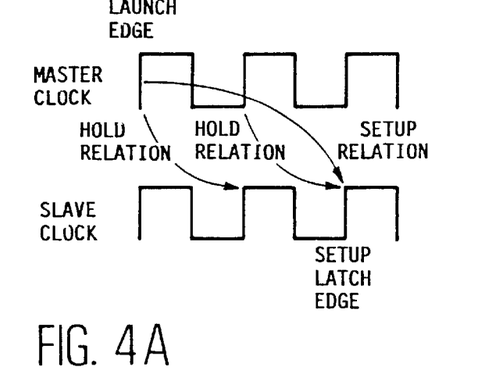
Figure 4B:
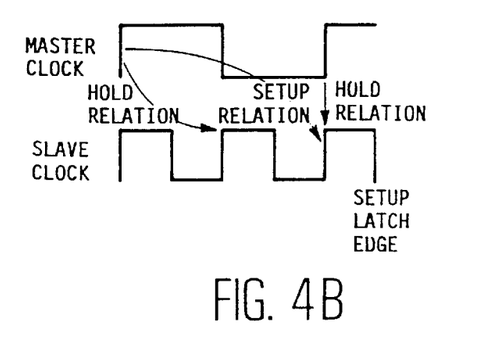

FIG. 4A presents a single frequency design with a setup multi-frequency design of two and a hold multiplier of zero on the slave flop. FIG. 4B presents a multi-frequency design with setup multiplier of two and a hold multiplier of zero on the slave clock.

In that example, while we under-constrain the maximum delay constraint introduced by the setup relation, we did create a real minimum delay constraint that did not previously exist. In the case where the previously defined shortest path is smaller than that minimum delay, the hold check process will report an error, while a circuit synthesis tool will try to fix it by slowing down the shortest path.

Figure 5A:
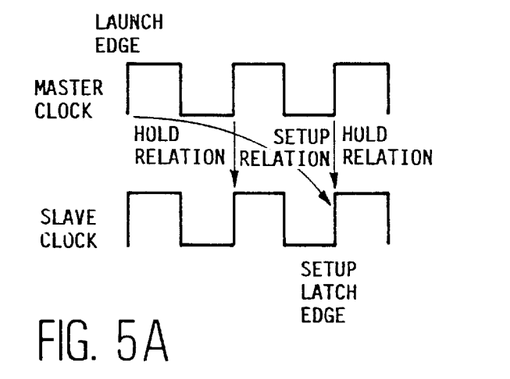
Figure 5B:
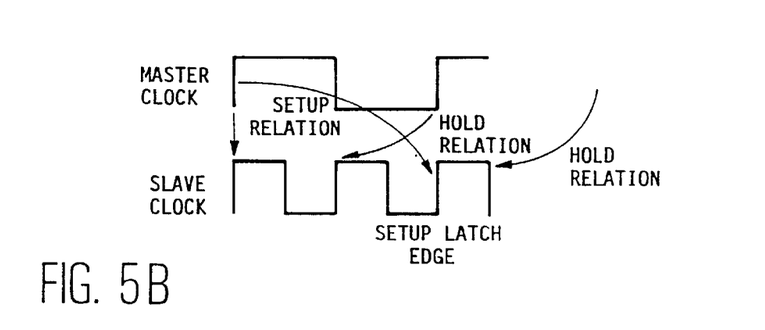

In some circumstances the circuit design engineer or test engineer know that some flip-flops will be disabled. For instance, in case of the single-frequency design, if both the master and the slave flip-flops are disabled on the second active edge, the hold check procedure can be programmed to take that into account by specifying a hold multiplier of one (see FIGS. 5A and 5B). In case of the multi-frequency design, if you know that the slave flip-flop is disabled on the second active edge of the slave clock, you may also tell it to the hold checker by setting a hold multiplier of one.

Specifying the Timing Constraints

The trivial way to specify a timing constraint is to specify values for four lists:

a list of input node names;

a list of input node arrival times;

a list of output node names;

a list of output node required times.

This is acceptable for specifying external arrival and required times on a small number of input and output ports (sometimes called connectors). However, when working with circuit designs having hundreds of connectors, the use of node names with wild cards are required to match in one statement a complete list of nodes. In addition, when the user wants to set a timing constraint coming from a clock declaration, the use of the "four list" approach is difficult for the two following reasons:

the list of nodes to specify is "design-specific", that is the list of input nodes should contain the names of all the sequential elements clocked by the clock. However, in large circuit designs it is difficult for the user to specify the complete list of all such sequential elements without omitting at least one;

the list of nodes to specify is "technology specific", that is the list of nodes contains the name of the data connector of the sequential elements, such as "q", "qn", "d", "da", "db", "s".

Introduction to the Compass Timing Constraints

All timing constraints are independent of each other. A timing constraint can never relax another timing constraint: the worst or most difficult timing constraint (the tightest one) always "wins" in that it is the one which will be the basis for determining if a circuit design meets all timing constraints, or will be the basis for implementing or optimizing a circuit design if the timing constraints are being used with a circuit optimization tool.

Within COMPASS tools there are four main constructs to specify timing constraints:

the path cluster constraint;

the clock constraint;

the grouped clock constraint;

the multi-cycle clock constraint.

The Path Cluster Constraint

A path cluster matches the timing constraint definition described above. Basically to specify a path cluster, the user must:

specify a path cluster name;

specify the input nodes belonging to the path cluster together with their arrival time; and specify the output nodes belonging to the path cluster together with their required time.

For instance in order to create a path cluster timing constraint between the input nodes "in1", "in2", "in3" and the output nodes "out1", "out2" and "out3" the user will specify something such as:

| set pathCluster pc1 | | |
|---|---|---|
| set arrivalTime | –max 0 in1 in2 in3 | –pathCluster pc1 |
| set requiredTime | –max 10 out1 out2 | –pathCluster pc1 |
| set requiredTime | –max 8 out3 | –pathCluster pc1 |

The Clock Constraint

A clock constraint on a design node specifies a timing constraint whose input nodes are the data output connectors of sequential elements clocked on the specified node and whose output nodes are the data input connectors of sequential elements clocked on the specified node. To create a clock constraint the user must declare a clock together with its attribute (e.g., period, waveform, latency, skew, . . . ) on a specified circuit node. An example of a clock constraint is:

set clock clk -period 10

This example creates a timing constraint whose:

input nodes are the data output connectors of the sequential element clocked by the clock clk;

input node maximum and minimum arrival times are the clock-to-data output propagation time of these sequential elements;

output nodes are the data input connectors of the sequential element clocked by the clock clk;

output maximum required times are the specified period values (in this case 10 ns) minus the setup time of these sequential element data input connectors;

output minimum required times are the hold time of these sequential element data input connectors.

Very often, combinational blocks starting on external input connectors and ending on sequential element data input connectors are also subject to a clock timing constraint. When a clock constraint is created as explained above, the user can complete the generation of the external input to data element input timing constraint by specifying a clock relative external delay on some external input connectors. An example is:

set clock clk -period 10 set externalDelay -in in1 1 -clock clk

The clock declaration creates exactly the same timing constraint as explained above. The clock-relative external delay completes the timing constraint with:

one input node which is the external connector "in1";

an arrival time on this input node which is 1 ns.

Very often, combinational blocks ending on external output connectors and starting on sequential element data output connectors are also subject to a clock timing constraint. When a clock constraint is created as explained above, the user can complete the generation of the data element output to external output node timing constraint by specifying a clock relative external delay on some external output connectors. An example is:

set clock clk -period 10 set externalDelay -out out1 3 -clock clk

The clock declaration creates exactly the same timing constraint as explained above. The clock-relative external delay completes the timing constraint with:

one output node which is the external connector "out1";

a required time on this output node which is 7 ns (computed as 10 ns minus 3 ns).

Grouping Clock Constraints

The input nodes and output nodes for "clock timing constraints" are the data input and output connectors of sequential element clocked by that clock. If a specified circuit design has more than one clock, creating the timing constraints for each of the different clocks does not automatically constrain paths starting on one flip-flop's input connector clocked on one clock and ending on another flip-flop's output connector clocked on another clock. To constrain such paths, the user must create the different clocks, and then must "group" these clocks. Two clocks are "grouped" by using the following command:

set clock clkMaster -period masterperiod set clock clkSlave -period slavePeriod set groupclock gr1 -master clkMaster -slave clkSlave Grouping two clock timing constraints actually creates a new timing constraint whose:

input nodes will either be data output connectors of sequential data elements clocked on the master clock or external input connectors for which external input delays have been specified relative to the master clock;

output nodes will either be data input connectors of sequential data elements clocked on slave-clock or external output connectors for which external output delays have been specified on the slave clock;

the arrival time and required times are computed according to the setup and hold relations, determined as explained above in the section "CLOCKED DESIGNS".

If the user is not satisfied with the default setup and hold relations automatically set by the setup and hold check procedures, the user can override those by specifying "setup multiplier" and "hold multiplier" together with the group clock constraint.

The Multi-Cycle Constraint

The previous section presented how to complete a clock timing constraint by specifying external delays or by grouping two clocks timing constraints together. This section explains how to remove some output nodes from a clock timing constraint or from a group of clock timing constraints in order to create a new timing constraint.

Assuming that in a specified circuit design some of the flip-flops are delimiting logic which must run at the clock frequency (for instance an adder) and that some other flip-flops are delimiting logic that can run at half the clock frequency (for instance a multiplier), the user first creates a clock timing constraint with the appropriate period. This will constrain the adder and the multiplier to the same timing constraint. Next the multiplier output nodes can be removed from the clock timing constraint and a new timing constraint can be created with a double period as its required time by using a multi-cycle timing constraint:

set clock clk -period 10 set multicycle mc1 -setup 2 -clock clk set multicycle mc1 -from ff1.dataoutput( ) ff2.dataoutput( )

set multicycle mc1 -to ff3.datainput( ) ff4.datainput( )

This will remove the output nodes ff3.datainput( ) and ff4.datainput( ) from the clock constraint and create a new timing constraint whose:

input nodes are the multi-cycle start point (ff1.dataoutput( ) and ff2.dataoutput( ));

input node arrival time are still the clock-to-dataoutput sequential element propagation time;

output nodes are the multi-cycle end point (ff3.datainput( ) and ff4.datainput( ));

output node maximum required time is the twice the period minus the sequential element setup time.

This "set multiCycle" commands remove the multi-cycle end nodes from the clock constraint. This is necessary, because otherwise these end nodes would still be optimized within the clock constraint, making the multi-cycle constraint useless. Moreover this will not remove the multi-cycle start nodes from the clock constraint; that is the multi-cycle start nodes will belong to both the multi-cycle constraint and the clock constraint. Furthermore, the same clock output node can be used in more than one multi-cycle constraint.

The following example reconstrains a pair of flip-flops from a group-clock:

set clock clk1 -period 10
set clock clk2 -period 20
set group clk1_clk2 -master clk1 -slave clk2
set multiCycle mc1 -setup 2 -groupclock clk1_clk2
set multiCycle mc1 -from ff1 .dataoutput( ) ff2.dataoutput( )
set multicycle mc1 -to ff3.datainput( ) ff4.datainput( )

In the previous example, ff1 and ff2 have to be clocked on clk1 and ff3 and ff4 on clk2, otherwise nothing will be constrained.

Figure 6:
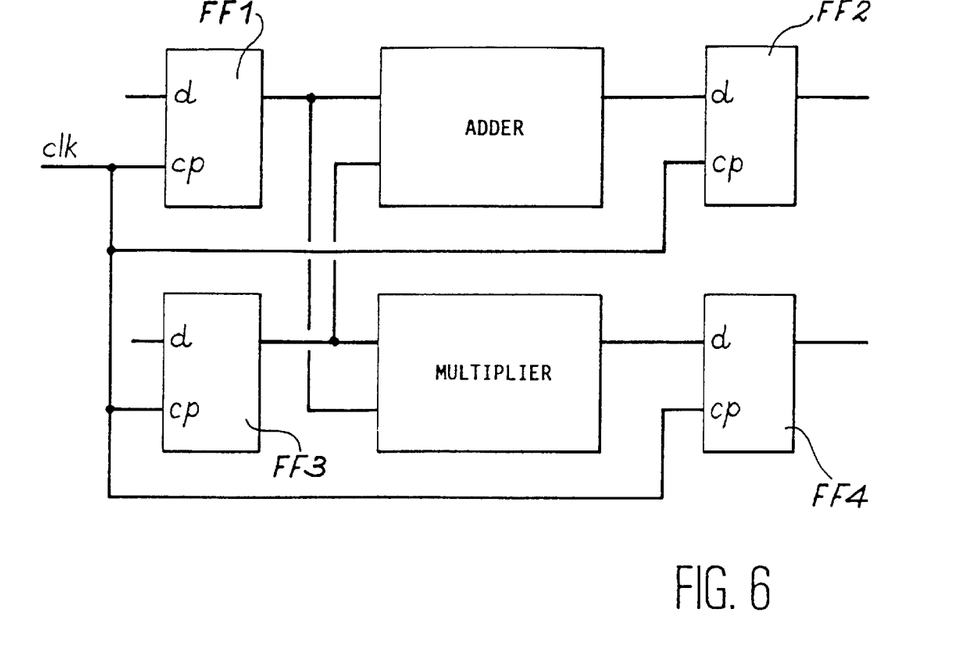
FIG. 6 shows a typical multi-cycle circuit design.

FIG. 6 presents a typical multi-cycle design, referred to in the following as a "MCD design". The MCD original design is composed of one adder and one multiplier surrounded by flip-flops clocked on the same clock "clk". In this example, the multiplier is twice as slow as the adder.

The usual way to specify the timing constraints for this multi-cycle design, is to use a multi-cycle construct such as the COMPASS timing constraint construct, which looks like:

set clock clk -period 10
set multicycle mc1 -setup 2 -clock clk -from ff3.q ff1.q -to ff4.d This will create the timing constraint represented by the following table:

| constraint name | input nodes | | output nodes | |
|---|---|---|---|---|
| | name | arrival time | name | required time |
| clk | ff1.q | 0ns | ff2.d | 10ns |
| | ff3.q | 0ns | | |
| mc1 | ff1.q | 0ns | ff4.d | 20ns |
| | ff3.q | 0ns | | |

Figure 7:
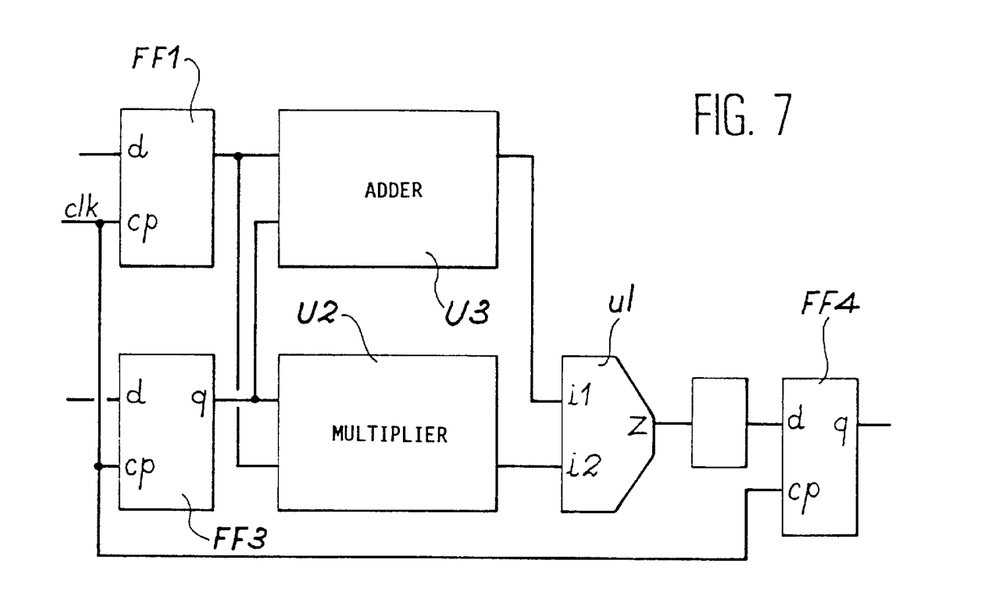
FIG. 7 shows an implementation of the circuit design represented in FIG. 6.

A problem occurs when the MCD design is implemented as represented in FIG. 7.

Indeed in this case, if the following timing constraint is used:

set clock clk -period 10
set multicycle mc1 -setup 2 -clock clk -from ff1.q ff3.q -to ff4.d then timing constraint created is the one represented by the following table:

| constraint name | input nodes | | output nodes | |
|---|---|---|---|---|
| | name | arrival time | name | required time |
| clk | ff1.q | 0ns | | |
| | ff3.q | 0ns | | |
| mc1 | ff1.q | 0ns | ff4.d | 20ns |
| | ff3.q | 0ns | | |

As shown, the above timing constraint specification results in the complete logic begin constrained on twice the clock period (20 ns). However, the timing constraint should provide a required time of 10 ns at ff4.d when the multiplexer u1 directs the adder output to flip-flop ff4.

In the prior art, the standard solution to this problem was to create an "external input delay" and an "external output delay" on both the multiplier and the adder output and then to specify a multi-cycle constraint on these outputs, as follows:

set clock clk -period 10
set externalDelay -in 15 u3.out u2.out clock clk
set externalDelay -out 5 u3.out u2.out clock clk
set multicycle mc1 -setup 1 -clock clk -to u3.out
set multicycle mc2 -setup 2 -clock clk -to u2.out There are three problems in that methodology:
1) The value "5" of the output delay has to be specified by the user and is computed assuming a delay of 5 ns from the multiplexer input to the data input of flip-flop ff4.
2) The value "15" of the input delay has to be specified by the user and is computed as twice the clock period minus input delay =20−5=15 ns.
3) The value "5" can be affected during the optimization of the design.

In addition, this methodology violates the definition of the external delay since the "external delays" are being used here to specify internal delays.

Another trivial but inconvenient solution is to enter one time constraint at a time, break the path through which the constraint should not be propagated and optimize the circuit design with that constraint. This is a difficult and error-prone process because for each iteration of the process the user must break all the paths through which the constraint should not be propagates, and must correctly specify the timing constraint for the path through which the constraint should be propagated.

SUMMARY OF THE INVENTION

It is a primary object of the present invention is to provide the user of both electronic circuit synthesis tools and electronic circuit timing verification tools with an improved system for specifying multi-cycle timing constraints in circuit designs.

Another object of the present invention is to provide a method for specifying and automatically analyzing multiple clock cycle timing constraints in a VLSI circuit.

The present invention provides a system and method for specifying and using a "constraint-based through path", which is a way to both:

correctly specify the timing paths (also called signal paths) to which multi-cycle timing constraints are applicable;

correctly specify the timing paths to which multi-cycle timing constraints are not applicable.

The "constraint-based through path" can be specified at either the circuit level, or at the HDL level before the circuit design is synthesized.

The "constraint specific through path" is composed of:
1. a set of "fromNode";
2. a set of "toNode";
3. a constraint Name.

More precisely the "constraint specific thou path" is defined by the following algorithm:

for each toNode belonging to toNodeNameList begin
for each timingArc driving toNode begin
mark all nodes in transitive fanin of toNode begin
if no fromNode in fromNodeNameList is marked then begin
break timingArc for the current constraint
end
end
end where a "timingArc" is a pin-to-pin timing path through one gate.

The method of the present invention comprises the following steps:

specify the timing constraint for the clock used to clock the flip-flops in the circuit;

specify the multi-cycle timing constraint for the multiplier;

specify the "through" path u1.i2→u1.z so as to prevent the multiplier's multi-cycle timing constraint from being applied to the adder;

specifying a multi-cycle constraint for the adder;

specifying a "through" path u1.i1→u1.z for the multiplier constraint so that the adder's multi-cycle constraint is not applied to the multiplier.

A system employing the present invention system, which uses the previously summarized method, comprises constraint-base thou path means, and checks the correct timing behavior of a circuit according to that specification.

The method of the present invention allows the user to correctly specify the timing constraints for a specified circuit design and to thereby provide the timing information required for optimal operation of a circuit synthesis tool or circuit timing verification tool, taking into account multi-cycle timing constraints.

BRIEF DESCRIPTION OF THE DRAWINGS

The invention is described with reference to the drawings in which.

DESCRIPTION OF THE PREFERRED EMBODIMENT

Figure 12:
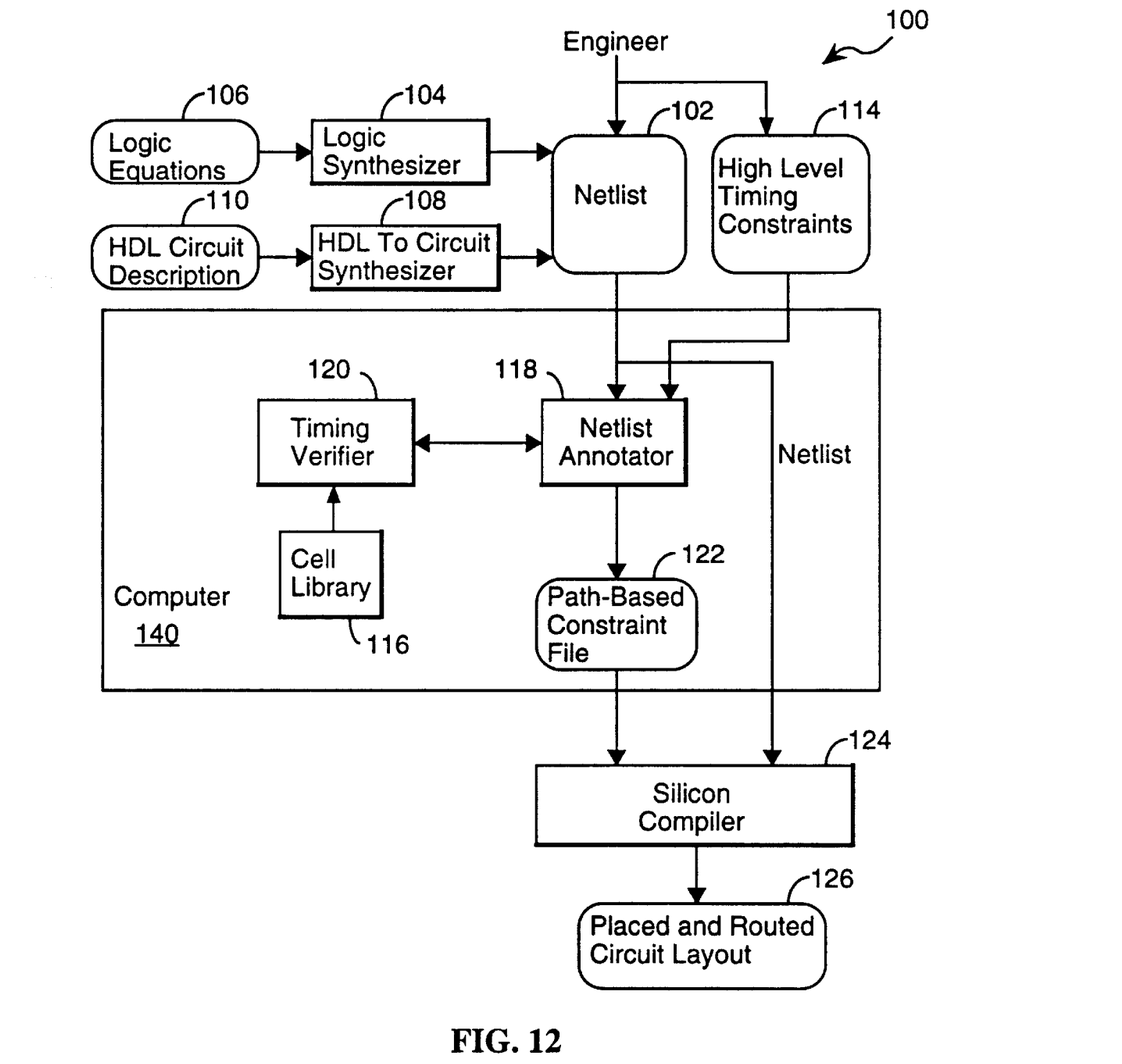
FIG. 12 is a flow diagram showing the flow of information in a preferred embodiment of the present invention.
Figure 13:
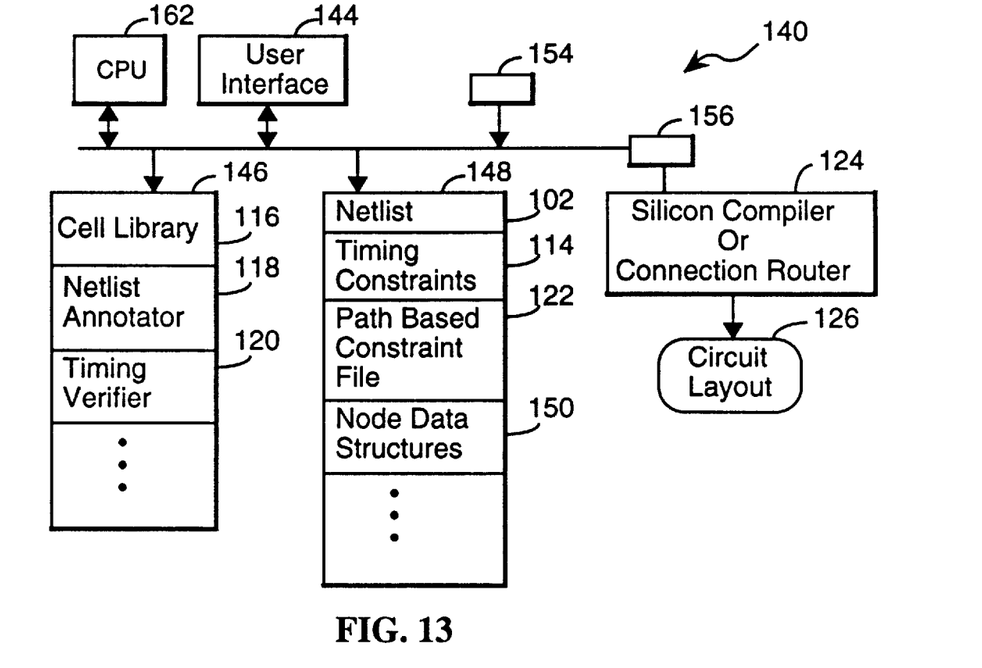
FIG. 13 is a block diagram of a computer aided design system incorporating the present invention.

Referring to FIGS. 12 and 13, the computer aided circuit design (CAD) system 100 of the present invention receives a circuit netlist 102 from any of a number of sources. For instance, the circuit netlist 102 may be directly generated and input by an engineer, or it may be generated by a logic synthesizer 104 from a set of logic equations 106 prepared by an engineer, or it may be generated by an HDL circuit synthesizer 108 from an HDL circuit description 110 written by an engineer.

The engineer will also generally specify a set of high level timing constraints 114 for the circuit as well as a cell library 116 for implementing the specified circuit with a particular set of circuit cells. The high level timing constraints 114 are typically specified by the engineer as a set of input signal timing values (i.e., input nodes and a start time for each input node) and a set of output signal timing values (i.e., output nodes and a required arrival time for each output node). The delay parameters of each cell in the circuit netlist are obtained from the specified cell library 116, as discussed above.

Netlist annotator procedure 118, in conjunction with timing verifier 120, generates a set of path-based constraints from the circuit netlist 102 and the high level timing constraints. The path-based constraints are stored in a path-based constraint file 122, and then passed to a timing driven silicon compiler 124 along with the circuit netlist 102. The silicon compiler 124 generates a circuit layout 126 that satisfies the timing constraints specified in the path-based constraint file 122, or an error message if it is unable to generate a circuit layout meeting those timing constraints.

As shown in FIG. 13, the preferred embodiment is implemented on a computer workstation 140 having a CPU 162, a user interface 144, disk or other memory storage 146 for storing the cell library 116, netlist annotator 118 and timing verifier 120, as well as other software modules. Random access memory 148 is used to store arrays of data such as the specified circuit netlist 102, an array of system level timing constraints 114, a file 122 of the path-based timing constraints generated by the netlist annotator 118, and node data structures 150 used during the process of generating the path-based timing constraints.

Data such as the netlist 102, high level timing constraints 114 and the like may be entered either through an input port 154 or through the user interface 144. When the path-based constraints for the specified netlist have been determined, the resulting file 122 is transmitted via port 156 to a silicon compiler or connection routing program 122.

The silicon compiler 124 may be any one of several commercially available silicon compilers that utilize path-based timing constraints, including the Compass Design cellCOmplier, by Compass Design Automation of San Jose, Calif.

Figure 14:
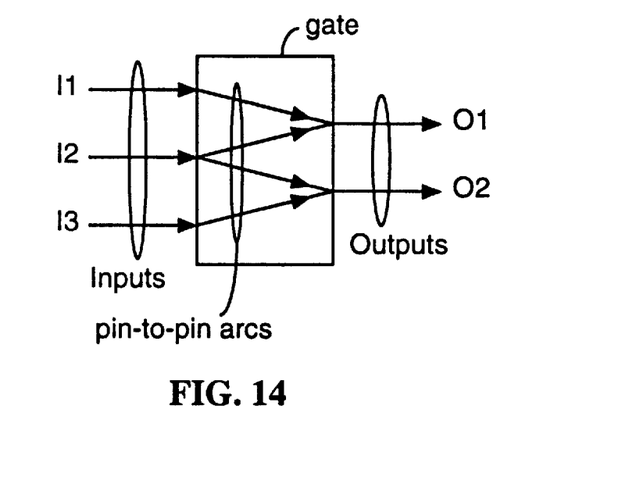
FIG. 14 schematically depicts the features of one circuit element or gate that are used in the path-based timing constraint generation procedure of the present invention.

Referring to FIG. 14, for purposes of handling timing constraints, each circuit element in a specified circuit is treated as a "box" or "gate" having inputs, outputs, pin-to-pin arcs connecting various ones of the input to various ones of the outputs, and a time delay value associated with each pin-to-pin arc. No other characteristics of the circuit elements are relevant to the procedure for generating path-based timing constraints.

Figure 15:
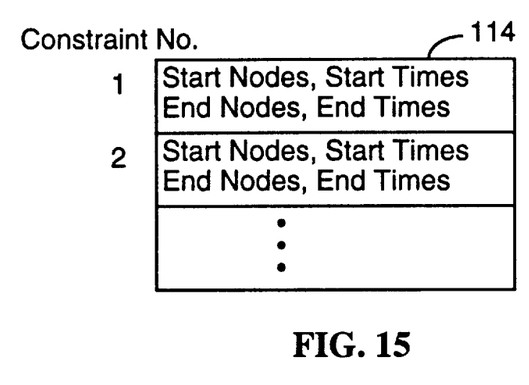
FIG. 15 depicts a data structure for representing system level timing constraints.

As shown in FIG. 15, the system level timing constraints are stored in a data structure 114 that represents multiple sets of distinct timing constraints. Each distinct constraint is represented by a set of start nodes (otherwise called input nodes), a start time for each such start node, a set of end nodes (otherwise known as output nodes) and a required arrival time for each such end node. Multiple system level timing constraints are often used to represent distinct timing requirements associated with a specified circuit's performance. Data structure 114 is also used to store the clock timing constraints and the constraint based "set through" specifications of the present invention.

The method of the present invention lets the user specify different timing constraints for different signal paths through a circuit. For example, in FIG. 7, according to the value of the selection bit of the multiplexer u1, the timing paths between, ff1 and ff3 on the one side of the multiplexer and ff4 the other side of the multiplexer should be one clock period or two clock periods, respectively. In other words, the timing constraint to apply depends on the multiplexer selection bit value. Clearly, the user of a circuit analysis tool for verifying that a circuit meets specified timing constraints, and the user of a circuit synthesis tool that optimizes a circuit design to as to meet specified timing constraints, both need a way to specify different timing constraints for different signal paths through a circuit. In the present invention the specification of signal path specific timing constraints is accomplished through the use of a construct called a "constraint specific through path".

A "constraint specific through path" is composed of:
1) a set, called the "fromNodeNameList," of "fromNode" circuit nodes;
2) a set, called the "toNodeNameList," of "toNode" circuit nodes;
3) a constraint name;

and is defined by the following procedure:

```
for each toNode belonging to NodeNameList begin
{
    for each timingArc driving toNode begin
    {
        mark all nodes in transitive fanin of toNode begin
        if no fromNode in fromNodeNameList is marked then
        begin
        {
            break timingArc for the current constraint
        } end
    } end
} end
``` where a "timingArc" is a pin-to-pin timing path through one gate.

In other words, a timing arc driving a toNode is broken for the specified constraint if it is not in the transitive fanout of a fromNode. A "constraint specific through path" is specified with the help of the following construct:

set through [-from <fromNodeNameList>] [-to <toNodeNameList>] [-constraint <constraintName>]

where:
    <fromNodeNameList> specifies a list of nodes;
    <toNodeNameList> specifies a list of nodes;
    constraint <constraintName> specifies the constraint for which the "through" path applies.

Going back to the FIG. 7, the way to correctly specify the timing constraints for the MCD design using the "set through" feature of the present invention is to go through the following steps:
1) set clock clk -period 10
2) set multicycle mc1 -setup 2 -clock clk -from ff1.q ff3.q - to ff4.d
3) set through -from u1.i2 -to u1.z -constraint mc1
4) set multicycle mc2 -setup 1 -clock clk -from ff1.q ff3.q - to ff4.d
5) set through -from u1.i1 -to u1.z -constraint mc2

An explanation of the above listed steps is as follows:
1. First (step 1) we specify the clock timing constraint; this applies a 10 ns timing constraint to all the logic circuitry between the input nodes ff1.q, ff3.q and the output node ff4.d.
2. Second (step 2) specifies a first multi-cycle timing constraint, mc1, for the multiplier.
3. Third (step 3) specifies a "through" path u1.i2→u1.z for the first multi-cycle timing constraint so that this timing constraint does not apply to the adder's signal path through the mulitplexer u1.i1→u1.z.
4. The multiplier in the first multi-cycle timing constraint unfortunately removes the ff4.d output node from the clock timing constraint. The direct consequence is that the adder is also no longer subject to the one clock period timing constraint. That is, while the adder is driven by the clock constraint input nodes (ff1.q and ff3.q), it does not have any output nodes to which the timing constraint applies. The fourth phase (step 4) thus consists in creating a second multi-cycle timing constraint for the adder. Note that the multiplier factor of that multi-cycle is "1".
5. The adder's multi-cycle timing constraint unfortunately applies a one clock period constraint to the complete combinational block composed of both the adder and the multiplier. The second multi-cycle timing constraint is thereby superseding the effect of the multiplier multi-cycle because it is applying a more stringent timing constraint. We thus need a fifth phase (step 5) which consists of defining a "through" path u1.i1→u1.z for the second multi-cycle timing constrain. In this way, the adder multi-cycle constraint does not constrain the multiplier.

This will create the following constraint:

| | input nodes | | output nodes | | |
|---|---|---|---|---|---|
| constraint name | name | arrival | name | required | through |
| clk | ff1.q | 0ns | | | |
| | ff3.q | 0ns | | | |
| mc1 | ff1.q | 0ns | ff4.d | 10ns | i1 → z |
| | ff1.q | 0ns | | | (u1) |
| mc2 | ff1.q | 0ns | ff4.d | 20ns | i2 → z |
| | ff1.q | 0ns | | | (u1) | where the different timing path constraints are correctly specified.

Figure 8:
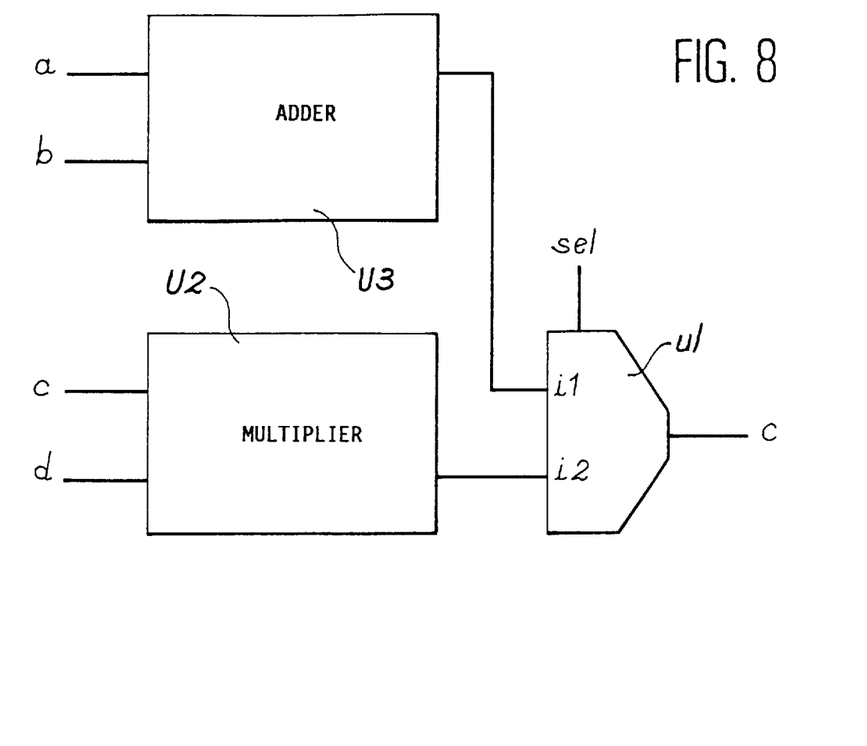
FIGS. 8 and 9 are used to illustrate the method of the present invention.

Nowadays, designs are often specified using an HDL description language and synthesized using commercial synthesis tools. Starting from the following VHDL circuit description:

```
entity dp is
    port (sel : in bit;
        a,b : in bit_vector (7 downto 0) ;
        c : out bit_vector (15 downto 0)
        ) ;
    end dp ;
architecture dp of dp is
begin
    c <= extend(a,16) + extend(b,16) when sel = '0' else a*b ;
end dp ;
``` which corresponds to the implementation of FIG. 8.

Specifying the fact that the multiplier is constrained to two times the clock period while the adder is constrained to just one clock period can be tedious: the user must know the name of the multiplexer instances together with its connector name. Even worse, at the end of the synthesis phase, the multiplexer circuit function is implemented with simple gates, not with a multiplexer gate. Moreover, the user would have to specify the timing constraints somewhat differently for each different circuit implementation of the VHDL circuit description.

Clearly enough, the user's task of specifying multi-cycle timing constraints is made more practical if the circuit nodes driving the multiplexer are named. The circuit nodes driving the multiplexer can be named by slightly modify the previously shown VHDL circuit description to read as follows:

```
entity dp is
    port (sel : in bit k;
        a,b : in bit_vector (7 downto 0) ;
        c : out bit_vector (15 downto 0)
        ) ;
end dp ;
architecture dp of dp is
    signal t1, t2 : bit_vector (15 downto 0) ;
begin
    t1 <= extend (a,16) + extend (b,16) ;
    t2 <= a * b ;
    c <= t1 when sel = '0' else t2 ;
end dp;
```

Figure 9:
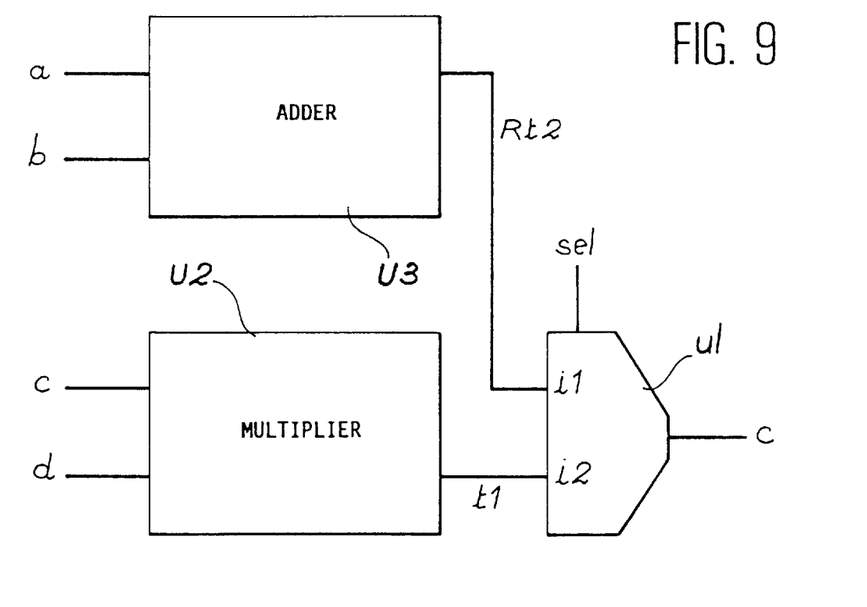

This will force the synthesizer to name the input nodes of the multiplexer with the names "t1" and "t2" (see FIG. 9).

The user can now specify timing constraints for the circuit design as follows, without having to worry about the multiplexer names:

1) set clock clk -period 10
2) set externalDelay -out 5 c
3) set externalDelay -in 0 a
4) set externalDelay -in 0 b
5) set multicycle mc1 -setup 2 -clock clk -from a b -to c
6) set thou -from t1 -to c -constraint mc1
7) set multicycle mc2 -setup 1 -clock clk -from a b -to c
8) set thou -from t1 -to c -constraint mc2

The advantages of the method of the present invention are:

- the user does not need to know the timing delay values of the circuit logic after the multiplexer;
- the circuit design will be correctly optimized even if the logic after the multiplexer is modified during a circuit timing optimization process;
- the method of the present invention is intuitive; the user do not have play any tricks with timing constraint constructs and can directly specify the timing constraints that he has in mind;
- the method of the present invention is general in that this methodology works well in conjunction with any other timing constraint; the user can break any timing path related to any timing constraint type;
- the method of the present invention provides users with a way to correctly specify "constraint specific through path" at the register transfer level (RTL), i.e., prior to synthesis of the circuit design from a HDL or RTL circuit description.

Figure 10:
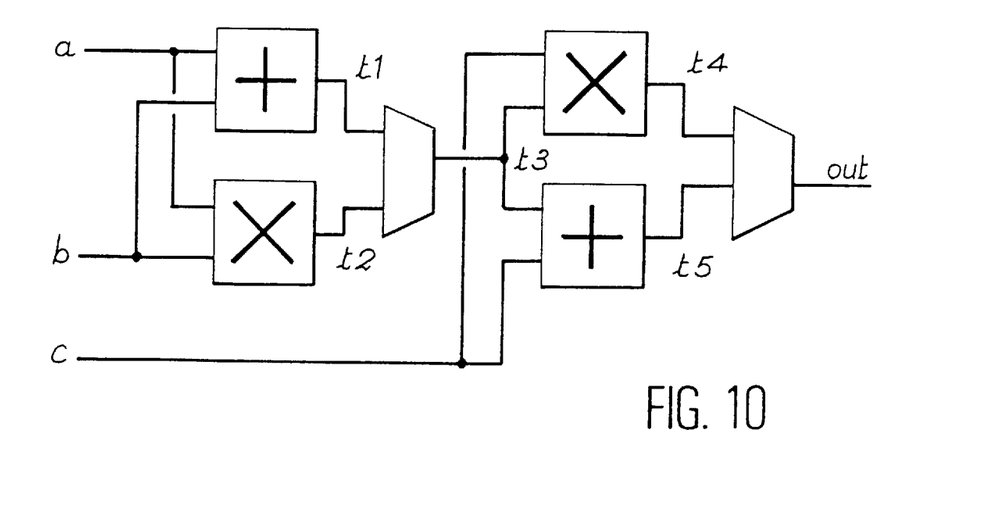
FIGS. 10 and 11 illustrates two examples using the method of the present invention.

The following example (see FIG. 10) illustrates the power of the "set through" command:

Assuming that the adders need one clock cycle and the multipliers need two clocks cycles to generate valid output values, the correct way to specify the timing constraints for this circuit design is as follows:

set clock clk -period 10
set externalDelay -out 0 out
set externalDelay -in 0 allinputs( )
set multicycle mc1 -setup 2 -clock clk -from allinputs( ) -to out
set through -from t1 -to t3 -constraint mc1
set through -from t5 -to out -constraint mc1
set multicycle mc2 -setup 3 -clock clk -from allinputs( ) -to out
set through -from t2 -to t3 -constraint mc2
set through -from t5 -to out -constraint mc2
set multicycle mc3 -setup 3 -clock clk -from allinputs( ) -to out
set through -from t1 -to t3 -constraint mc3
set through -from t4 -to out -constraint mc3
set multicycle mc4 -setup 4 -clock clk -from allInputs( ) -to out
set through -from t2 -to t3 -constraint mc4
set through -from t4 -to out -constraint mc4

Figure 11:
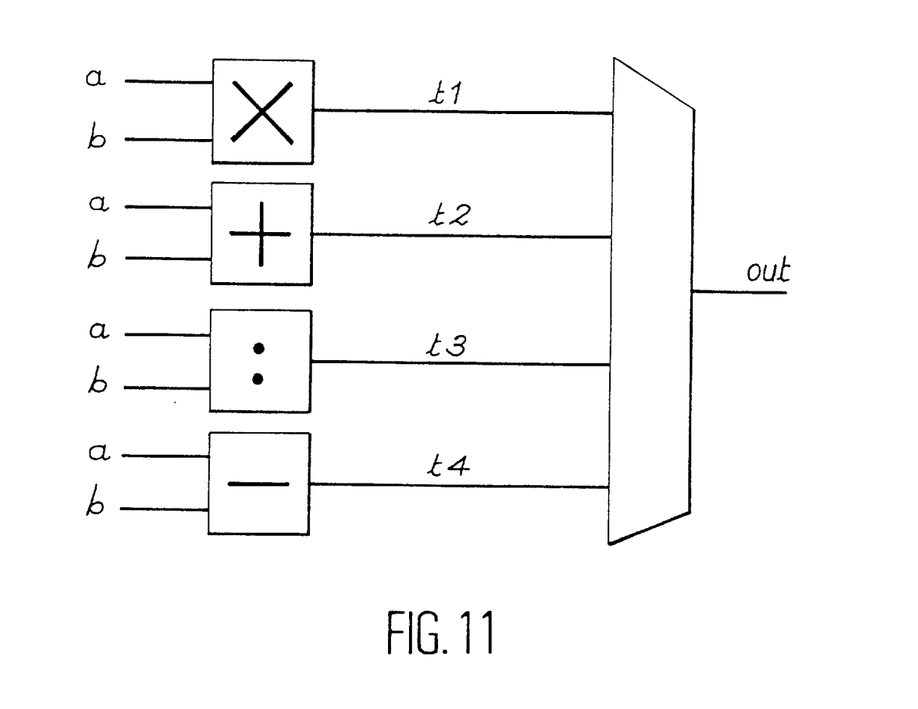

The following example shows how to take the advantage of the "set through" from node list (see FIG. 11).

In this design, both the adder and the subtracter are subject to a one clock cycle timing constraint, while both the multiplier and the "divider" are subject to a three clock cycles timing constraint. The correct way to specify these timing constraints is:

set clock clk -period 10
set externalDelay -out 0 out
set externalDelay -in 0 allinputs( )
set multicycle-name mc1 -mult 3 -clock clk -start allinputs( ) -end out
set through -from t1 t3 -to out -constraint mc1
set multicycle-name mc2-mult 1-clock clk-start allinputs( ) -end out
set through -from t2 t4 -to out -constraint mc2

In a preferred embodiment, the system level timing constraints, clock timing constraints, multi-cycle timing constraints and constraint based timing path specifications are analyzed by a timing verifier 120 (see FIG. 1) to determine whether or not the specified circuit meets all the specified timing constraints, using the cell delay data stored in cell library 116. The timing verifier propagates signal arrival times at each of the circuit's interconnected components, and back-propagates required signal arrival times at each of the interconnected components. When applying multi-cycle timing constraints to the specified circuit, signal arrival times and required signal arrival times are propagated and back-propagated only through signal paths consistent with the constraint based timing path specifications.

Similarly, when the circuit netlist and timing constraint specifications are passed to a silicon compiler, the silicon compiler will place and route circuit cells so as to meet the specified timing constraints, and will limit the signal paths to which the specified multi-cycle clock timing constraints are applied in accordance with the constraint based timing path specifications.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of specifying and analyzing multiple timing constraints in an integrated circuit, the steps of the method comprising:

(A) receiving and storing in a computer memory a netlist denoting a list of components in said integrated circuit and a set of nodes interconnecting said components; each said component of said integrated circuit having at least one input port and at least one output port, said set of nodes including a set of circuit input nodes and circuit output nodes for said integrated circuit;

(B) receiving and storing in said computer memory a plurality of system level timing constraints, said system level timing constraints representing maximum delay times for signals to propagate from input nodes to output nodes of said integrated circuit;

(C) receiving and storing in said computer memory data at least one clock timing constraint and a plurality multi-cycle timing constraints, said clock timing constraint and said multi-cycle timing constraints specifying clock based timing constraints for the transmission of data between sequential data elements in which at least a subset of said clock based timing constraints concern timing constraints for duration longer than a single clock period;

(D) receiving and storing in said computer memory a plurality of constraint based timing path specifications, each indicating signal paths through said integrated circuit to which specified ones of said multi-cycle timing constraints are applicable and signal paths to which said specified ones of said multi-cycle timing constraints are not applicable; and (E) verifying satisfaction of said timing constraints by said integrated circuit.

2. The method of claim 1 wherein said verifying step includes the steps of:

propagating signal arrival times at each of said plurality of interconnected components; and back-propagating required signal arrival times at each of said plurality of interconnected components;

wherein for multi-cycle timing constraints, signal arrival times and required signal arrival times are propagated and back-propagated only through signal paths consistent with said stored constraint based timing path specifications.

3. The method of claim 1, further including:

(G) passing said netlist, timing constraints and constraint based timing path specifications to a silicon compiler and automatically placing/routing a circuit in accordance with said netlist, timing constraints and constraint based timing path specifications.

4. A computer aided circuit design system for synthesizing an integrated circuit, comprising:

(A) a computer memory;

(B) a netlist stored in said computer memory, said netlist denoting a list of components in said integrated circuit and a set of nodes interconnecting said components; each said component of said integrated circuit having at least one input port and at least one output port, said set of nodes including a set of circuit input nodes and circuit output nodes for said integrated circuit;

(C) a plurality of system level timing constraints stored in said computer memory, said system level timing constraints representing maximum delay times for signals to propagate from respective ones of said input nodes to respective ones of said output nodes of said integrated circuit;

(D) at least one clock timing constraint and a plurality multi-cycle timing constraints, stored in said computer memory, said clock timing constraint and said multi-cycle timing constraints specifying clock based timing constraints for the transmission of data between sequential data elements in which at least a subset of said clock based timing constraints concern timing constraints for duration longer than a single clock period;

(E) a plurality of constraint based timing path specifications stored in said memory, each indicating signal paths through said integrated circuit to which specified ones of said multi-cycle timing constraints are applicable and signal paths to which said specified ones of said multi-cycle timing constraints are not applicable;

(F) cell delay data stored in said computer memory, said cell delay data representing signal delays associated with said components in said integrated circuit; and (G) a timing verifier for automatically determining whether an integrated circuit designed in accordance with said netlist would satisfy said timing constraints.

5. The system of claim 4 wherein said timing verifier:

propagates signal arrival times at each of said plurality of interconnected components; and back-propagates required signal arrival times at each of said plurality of interconnected components;

wherein for multi-cycle timing constraints, signal arrival times and required signal arrival times are propagated and back-propagated by said timing verifier only through signal paths consistent with said stored constraint based timing path specifications.

6. The system of claim 4, further including:

(H) a silicon compiler for automatically placing/routing an integrated circuit in according with said netlist, timing constraints and constraint based timing path specifications.

7. A computer aided circuit design system for synthesizing an integrated circuit, comprising:

(A) a computer memory;

(B) a netlist stored in said computer memory, said netlist denoting a list of components in said integrated circuit and a set of nodes interconnecting said components; each said component of said integrated circuit having at least one input port and at least one output port, said set of nodes including a set of circuit input nodes and circuit output nodes for said integrated circuit;

(C) a plurality of system level timing constraints stored in said computer memory, said system level timing constraints representing maximum delay times for signals to propagate from respective ones of said input nodes to respective ones of said output nodes of said integrated circuit;

(D) at least one clock timing constraint and a plurality multi-cycle timing constraints, stored in said computer memory, said clock timing constraint and said multi-cycle timing constraints specifying clock based timing constraints for the transmission of data between sequential data elements in which at least a subset of said clock based timing constraints concern timing constraints for duration longer than a single clock period;

(E) a plurality of constraint based timing path specifications stored in said memory, each indicating signal paths through said integrated circuit to which specified ones of said multi-cycle timing constraints are applicable and signal paths to which said specified ones of said multi-cycle timing constraints are not applicable;

(F) cell delay data stored in said computer memory, said cell delay data representing signal delays associated with said components in said integrated circuit; and (G) a silicon compiler for automatically placing/routing an integrated circuit in according with said netlist, timing constraints and constraint based timing path specifications.

* * * * *